United States Patent
Baumann et al.

(10) Patent No.: US 9,041,422 B2
(45) Date of Patent: May 26, 2015

(54) CIRCUIT ARRANGEMENT WITH A PLURALITY OF ON-CHIP MONITOR CIRCUITS AND A CONTROL CIRCUIT AND CORRESPONDING METHODS

(75) Inventors: Thomas Baumann, Anzing (DE); Christian Pacha, Grasbrunn-Neukeferloh (DE)

(73) Assignee: INTEL MOBILE COMMUNICATIONS GMBH, Neubiberg (DE)

( * ) Notice: Subject to any disclaimer, the term of this patent is extended or adjusted under 35 U.S.C. 154(b) by 399 days.

(21) Appl. No.: 13/076,434

(22) Filed: Mar. 31, 2011

(65) Prior Publication Data

US 2012/0249170 A1 Oct. 4, 2012

(51) Int. Cl.
G01R 31/00 (2006.01)
G01R 31/28 (2006.01)
G01D 18/00 (2006.01)
G01R 31/30 (2006.01)

(52) U.S. Cl.
CPC .......... *G01R 31/2843* (2013.01); *G01D 18/002* (2013.01); *G01R 31/30* (2013.01)

(58) Field of Classification Search
CPC .................................................. G01R 31/3191
USPC ....................... 324/750.01–750.03
See application file for complete search history.

(56) References Cited

U.S. PATENT DOCUMENTS

| | | | | |
|---|---|---|---|---|
| 5,074,368 A * | 12/1991 | Bullivant | | 177/50 |
| 5,884,236 A * | 3/1999 | Ito | | 702/89 |
| 6,518,782 B1 * | 2/2003 | Turner | | 324/750.03 |
| 7,209,013 B2 * | 4/2007 | Norman et al. | | 331/65 |
| 7,408,369 B2 * | 8/2008 | MacLean et al. | | 324/750.03 |
| 8,049,827 B2 * | 11/2011 | Wang et al. | | 349/37 |
| 8,653,824 B1 * | 2/2014 | Liu et al. | | 324/522 |
| 2001/0007091 A1 * | 7/2001 | Walter et al. | | 702/107 |
| 2005/0256660 A1 | 11/2005 | Laraia et al. | | |
| 2009/0204340 A1 * | 8/2009 | Feldman et al. | | 702/19 |
| 2010/0312513 A1 * | 12/2010 | Mayor et al. | | 702/104 |
| 2011/0029266 A1 | 2/2011 | Lee | | |
| 2011/0095777 A1 * | 4/2011 | Komoto et al. | | 324/756.01 |
| 2012/0056667 A1 * | 3/2012 | Feng et al. | | 327/551 |

OTHER PUBLICATIONS

Ogasahara et al., "All-Digital Ring-Oscillator-Based Macro for Sensing Dynamic Supply Noise Waveform", IEEE Journel of Solid-State Circuits, vol. 44, No. 6, Jun. 2009, pp. 1745-1755.

Fick et al.; "In Situ Delay-Slack Monitor for High-Performance Processors Using an All-Digital Self-Calibrating 5ps Resolution Time-to-Digital Converter", IEEE International Solid-State Circuits Conference, 2010, Session 9, Digital Circuits and Sensors, 9.8, pp. 188-189.

C. Pacha, T. Baumann, "On-Chip Self Calibrating Delay Monitoring Circuitry", IFX ID 2009 E 51402.

(Continued)

*Primary Examiner* — Huy Q Phan
*Assistant Examiner* — Dustin Dickinson

(57) ABSTRACT

Implementations are presented herein that include a plurality of on-chip monitor circuits and a controller. Each of the plurality of on-chip monitor circuits is configured to measure a parameter of a semiconductor chip. The controller is coupled to the plurality of on-chip monitor circuits. The controller is configured to receive a measurement result from at least one of the plurality of on-chip monitor circuits and to control a calibration of another one of the plurality of on-chip monitor circuits in accordance with the measurement result.

24 Claims, 7 Drawing Sheets

(56) References Cited

OTHER PUBLICATIONS

C. Pacha, T. Baumann, "Circuit Arrangement with a Test Circuit and a Reference Circuit and Corresponding Method", IFX ID 2008 E 51818.

Gammie et al., "SmartReflex Power and Performance Management Technologies for 90 nm, 65 nm, and 45 nm Mobile Application Processors", Proceedings of the IEEE, vol. 98, 2010, p. 144-159.

Jan M. Rabaey, "Scaling the Power Wall, A Systems Perspective", Si2/OpenAccess Conference, Apr. 16, 2008.

Poirier et al., Power and Temperature Control on a 90nm Itanium-Family Processor, IEEE International Solid-State Circuits Conference, 2005, Session 16, Clock Distribution and Power Management, 16.7, pp. 304-305.

Casio, Produkte, Uhren, PRW-1300-1 VER, S. 1-2 URL: http://www.casio-europe.com/euro/watch/sports/prw-1300-1ver/.

Casio, Meilensteine, 2010, S. 1 URL: http://www.casio-europe.com/euro/watch/milestones/.

* cited by examiner

US 9,041,422 B2

CIRCUIT ARRANGEMENT WITH A PLURALITY OF ON-CHIP MONITOR CIRCUITS AND A CONTROL CIRCUIT AND CORRESPONDING METHODS

TECHNICAL FIELD

Various embodiments relate to a circuit arrangement with a plurality of on-chip monitor circuits and a control circuit, and corresponding methods.

BACKGROUND

Modern electronic systems, for example, mobile phones, digital cameras and personal digital assistants, have an ever increasing demand for highly-integrated and energy-efficient semiconductor circuits. In order to meet these requirements, the physical size of field effect transistors (FETs) within the semiconductor circuits is reduced. Due to the shrinking size, the FETs become more susceptible to variations of parameters of the semiconductor circuits, like process, supply voltage, aging of the devices, and temperature. Traditionally, these variations are modeled by guard-banding, i.e., safety margins may be added to allow for a robust operation of the semiconductor circuits. However, safety margins are expensive in terms of area and power dissipation.

On-chip monitor circuits may be implemented to measure the actual status of the semiconductor circuits with respect to certain variations. Countermeasures or adaptive techniques may be initiated on a circuit level or a system level responsive to the measurement results of the on-chip monitor circuits. A specific on-chip monitor circuit is typically designed to measure one specific effect, such as the process performance class with high measurement accuracy. Further variations such as process or supply voltage are acting as disturbing effects during the measurement and will reduce the measurement accuracy of a specific on-chip monitor circuit.

A sensitivity of the on-chip monitor circuit to disturbing effects should be as small as possible to avoid a corruption of the measurement results. A thorough design of the on-chip monitor may decrease the sensitivity to disturbing effects. If the sensitivity of the on-chip monitor circuit to disturbing effects cannot completely eliminated, a calibration of the on-chip monitor circuit may be required to compensate for the disturbing effects. The calibration may be performed during fabrication, after fabrication or during operation of the on-chip monitor circuit. The calibration of an on-chip monitor may be implemented by providing a circuitry that modifies the electrical behavior of the monitor, i.e. the monitor operation can be switched between several, predefined configuration settings. During calibration, one specific predefined configuration setting may be selected that provides the best measurement accuracy and stored for later use of the monitor in a measurement mode. The selected configuration setting may be stored in a register, a volatile memory, a nonvolatile memory, or an electrical fuse. The register, the volatile memory, the nonvolatile memory, or the electrical fuse may be implemented on the same semiconductor substrate as the on-chip monitor or implemented on a separate semiconductor substrate.

BRIEF DESCRIPTION OF THE DRAWINGS

The detailed description is described with reference to the accompanying figures. In the figures, the left-most digit of a reference number identifies the figure in which the reference number first appears. The use of similar reference numbers in different instances in the description and the figures may indicate similar or identical items.

DETAILED DESCRIPTION

Figure 1:
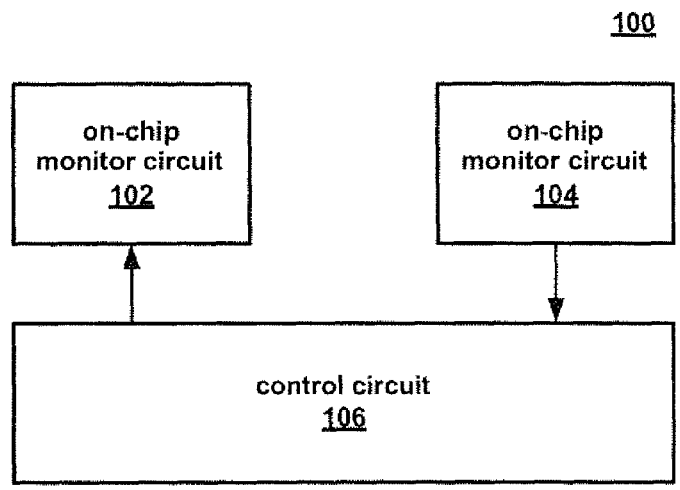
FIG. 1 illustrates an exemplary circuit arrangement with a plurality of on-chip monitor circuits and a controller.

Disclosed herein are techniques for monitoring a parameter of a semiconductor chip. According to one implementation, a circuit arrangement includes a plurality of on-chip monitor circuits. Each of the plurality of on-chip monitor circuits is configured to measure a parameter of a semiconductor chip. The circuit arrangement further includes a controller that is coupled to the plurality of on-chip monitor circuits. The controller is configured to receive a measurement result from at least one of the plurality of on-chip monitor circuits and to control a calibration of another one of the plurality of on-chip monitor circuits in accordance with the measurement result.

In various embodiments, a controller may be implemented by any kind of logic, e.g. digital logic such as e.g. a hardwired logic and/or programmable logic. In various embodiments, a controller may be implemented by e.g. as a processor, e.g. a microprocessor (e.g. a CISC microprocessor or a RISC microprocessor), as a programmable gate array (PGA) or a field programmable gate array (FPGA), or the like.

According to another implementation, a circuit arrangement includes a plurality of on-chip monitor circuits that are arranged in a network. Each of the plurality of on-chip monitor circuits configured to measure at least one parameter of a semiconductor chip. The circuit arrangement further includes a controller that is coupled to the network of on-chip monitor circuits. The controller is configured to receive measurement results from the plurality of on-chip monitor circuits and to generate an output in accordance with an evaluation of the measurement results. The circuit arrangement further includes at least one feedback loop that is coupled to the controller and the network. The at least one feedback loop is configured to control a calibration of at least one of the plurality of on-chip monitor circuits in accordance with the output.

According to another embodiment, a method is provided for supervising an on-chip monitor circuit. A measurement of at least one of a plurality of on-chip monitor circuits is started and each of the plurality of on-chip monitor circuits is configured to measure a parameter of a semiconductor chip. Further, a measurement of an on-chip monitor circuit to be supervised is started and the on-chip monitor circuit to be supervised is configured to measure a parameter of the semiconductor chip. Further, at least one measurement result from the at least one of the plurality of on-chip monitor circuits is processed. A measurement result of the on-chip monitor circuit to be supervised is denoted as invalid if the at least one measurement result from the at least one of the plurality of on-chip monitor circuits deviates from a predetermined range.

According to another embodiment, a method is provided for calibrating an on-chip monitor circuit. A plurality of on-chip monitor circuits configured to measure at least one parameter of a semiconductor chip is activated. Further, an on-chip monitor circuit to be calibrated is activated. Measurement results from the plurality of on-chip monitor circuits are combined. Further, a calibration of the on-chip monitor circuit to be calibrated is controlled in accordance with the combination of the measurement results.

Implementations as illustrated and described hereby may allow for an accurate calibration of on-chip monitor circuits and an accurate measurement of chip parameters. Variations of operating conditions may be detected during a calibration phase or a measurement phase and a calibration or a measurement may be repeated in case of significant variations of operating conditions. In addition, the implementations as illustrated and described hereby may only require a small area and may only have a low power consumption.

The techniques described herein may be implemented in a number of ways. Examples and context are provided below with reference to the included figures and ongoing discussion.

Exemplary Devices

FIG. 1 shows a schematic diagram of an exemplary circuit arrangement 100 that includes a plurality of on-chip monitor circuits 102 and 104 and a controller 106. Each of the plurality of on-chip monitor circuits 102 and 104 is configured to measure a parameter of a semiconductor chip. The controller 106 is coupled to the plurality of on-chip monitor circuits 102 and 104 and is configured to receive a measurement result from at least one 104 of the plurality of on-chip monitor circuits 102 and 104. The controller 106 is further configured to control a calibration of another one 102 of the plurality of on-chip monitor circuits 102 and 104 in accordance with the measurement result.

As illustrated in FIG. 1, the plurality of on-chip monitor circuits 102 and 104 may include two on-chip monitor circuits 102 and 104, i.e., a first on-chip monitor circuit 102 and a second on-chip monitor circuit 104. Alternatively, the plurality of on-chip monitor circuits may include more than two on-chip monitor circuits. Each of the plurality of on-chip monitor circuits 102 and 104 may be configured to measure one or several parameters of the semiconductor chip. A measurement result provided by one of the on-chip monitor circuits 102 and 104 may correspond to a current state of a parameter of the semiconductor chip. An on-chip monitor circuit may be configured to measure a parameter, such as a temperature, a supply voltage, a circuit delay, a frequency, an aging state, a process variation, a dynamic power dissipation or a leakage current. Additionally or alternatively, an on-chip monitor circuit may be configured to measure CMOS device parameters, such as drive current and threshold voltage, or a resistance and coupling capacitances of on-chip interconnects. An on-chip monitor circuit may include, e.g., a ring oscillator, a line of delay elements and/or a time-to-digital converter to measure the one or several parameters. Additionally or alternatively, the on-chip monitor circuit may include a sensor, e.g. a thermal sensor, to measure the one or several parameters. The on-chip monitor circuit may include all-digital logic, all-analog logic or both, digital and analog logic.

The controller 106 may control a calibration of the first on-chip monitor circuit 102 by receiving a measurement result from the second on-chip monitor circuit 104 and by checking if the measurement result falls within a predetermined range. If the measurement result deviates from the predetermined range, the calibration of the first on-chip monitor circuit 102 may be invalid and the calibration may be repeated. For example, the controller 106 may interrupt the calibration and initiate a re-start of the calibration of the first on-chip monitor circuit 102. If the measurement result does not deviate from the predetermined range, the calibration of the first on-chip monitor circuit 102 may be valid and finished.

In one implementation, the first on-chip monitor circuit 102 may be an on-chip monitor circuit to be calibrated and the second on-chip monitor circuit 104 may be an on-chip monitor circuit that supervises a calibration of the on-chip monitor circuit to be calibrated 102. For example, the supervising on-chip monitor circuit 104 may measure a supply voltage VDD of the on-chip monitor circuit to be calibrated 102 during the calibration of the on-chip monitor circuit to be calibrated 102. The controller 106 may receive a plurality of measurement results of the supply voltage VDD from the supervising on-chip monitor circuit 104 within a predetermined period. The controller 106 may control the calibration of the on-chip monitor circuit to be calibrated 102 in accordance with a combination of the plurality of measurement results received. Additionally or alternatively, the controller 106 may detect if at least one of the plurality of measurement results deviates from a predetermined range.

Figure 2:
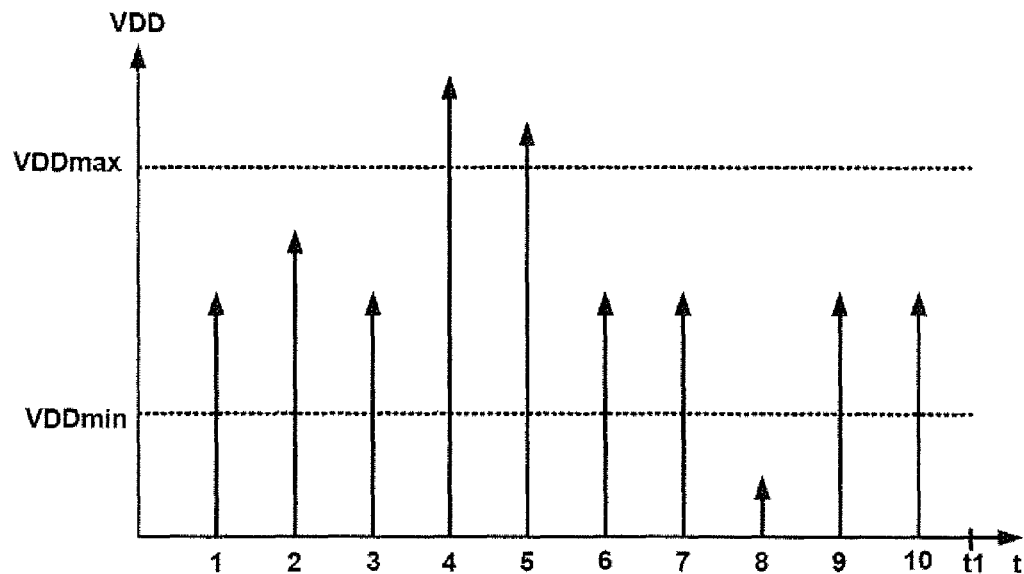
FIG. 2 illustrates a graph showing a supply voltage of an on-chip monitor circuit to be calibrated during a calibration.

FIG. 2 illustrates a graph showing a supply voltage VDD of the on-chip monitor circuit to be calibrated 102 during a calibration. The calibration of the on-chip monitor circuit to be calibrated 102 may take a predetermined time period t1, herein called calibration phase t1. During the calibration phase t1, the supervising on-chip monitor circuit 104 may perform ten measurements of the supply voltage VDD and may provide ten measurement results 1, 2, 3 . . . 10 to the controller 106. The controller 106 may check for each of the ten measurement results 1, 2, 3 . . . 10 if it deviates from a predetermined voltage range that is defined by a lower voltage level VDDmin and an upper voltage level VDDmax. For example, as illustrated in FIG. 2, measurement results number 4 and number 5 exceed the upper voltage level VDDmax and measurement result number 8 falls below the lower voltage level VDDmin. As at least one of the measurement results deviates from the predetermined range, the controller 106 may denote the calibration of the on-chip monitor circuit to be calibrated 102 as invalid. In addition, the controller 106 may control the calibration of the on-chip monitor circuit 102 by initiating a repeat of the calibration.

Generally, substantial variations of operating conditions may prevent an accurate calibration of the on-chip monitor circuit to be calibrated 102. For example, significant variations of the supply voltage VDD may prevent an accurate calibration of the on-chip monitor circuit to be calibrated 102. By continuously monitoring the supply voltage VDD during the calibration phase t1 of the on-chip monitor circuit to be calibrated 102, a distortion of the calibration by temporal variations of the supply voltage VDD may be detected. The calibration of the on-chip monitor circuit to be calibrated 102 may be denoted as invalid and may be discarded if the supply voltage VDD varies widely during the calibration phase t1, i.e., if the supply voltage VDD is not stable. The calibration of the on-chip monitor circuit to be calibrated 102 may be interrupted and re-started.

Figure 3:
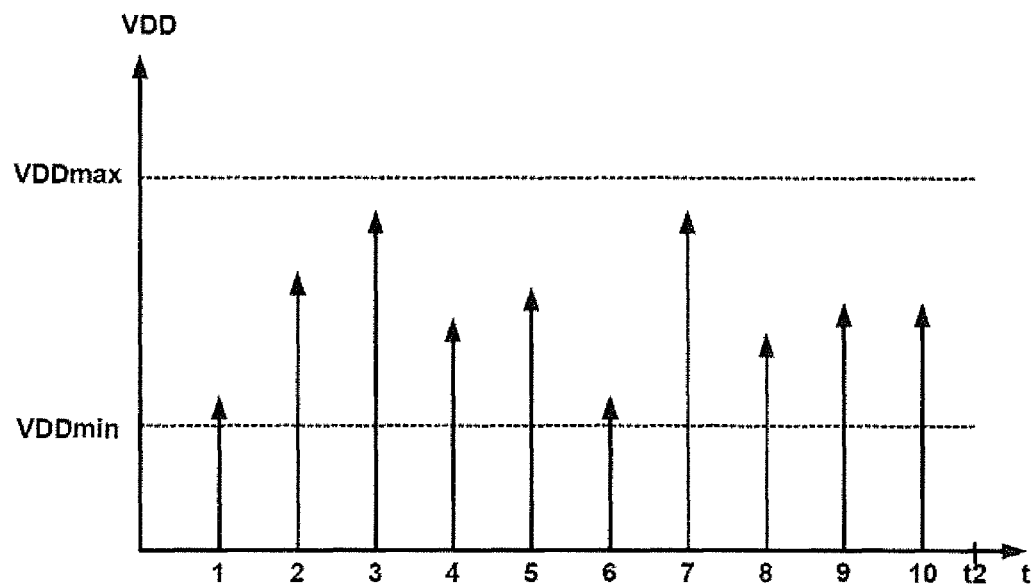
FIG. 3 illustrates a further graph showing a supply voltage of an on-chip monitor circuit to be calibrated during a calibration.

FIG. 3 illustrates a further graph showing the supply voltage VDD of the on-chip monitor circuit to be calibrated 102 during a calibration. The calibration of the on-chip monitor circuit to be calibrated 102 may take a predetermined time period t2, herein called calibration phase t2. During the calibration phase t2, the supervising on-chip monitor circuit 104 may perform ten measurements of the supply voltage VDD and may provide ten measurement results 1, 2, 3 . . . 10 to the controller 106. Each of the ten measurement results 1, 2, 3 . . . 10 may fall within the predetermined voltage range that is defined by the lower voltage level VDDmin and the upper voltage level VDDmax. Therefore, the controller 106 may denote the calibration of the on-chip monitor circuit to be calibrated 102 as valid and the calibration of the on-chip monitor circuit to be calibrated 102 may be finished.

During the calibration phase t2 of the on-chip monitor circuit to be calibrated 102, no significant variation of the supply voltage VDD may occur and the calibration of the on-chip monitor circuit to be calibrated 102 may not be disturbed. An accurate calibration of the on-chip monitor circuit to be calibrated 102 may be performed with the supply voltage VDD being stable during the calibration phase t2.

Figure 4:
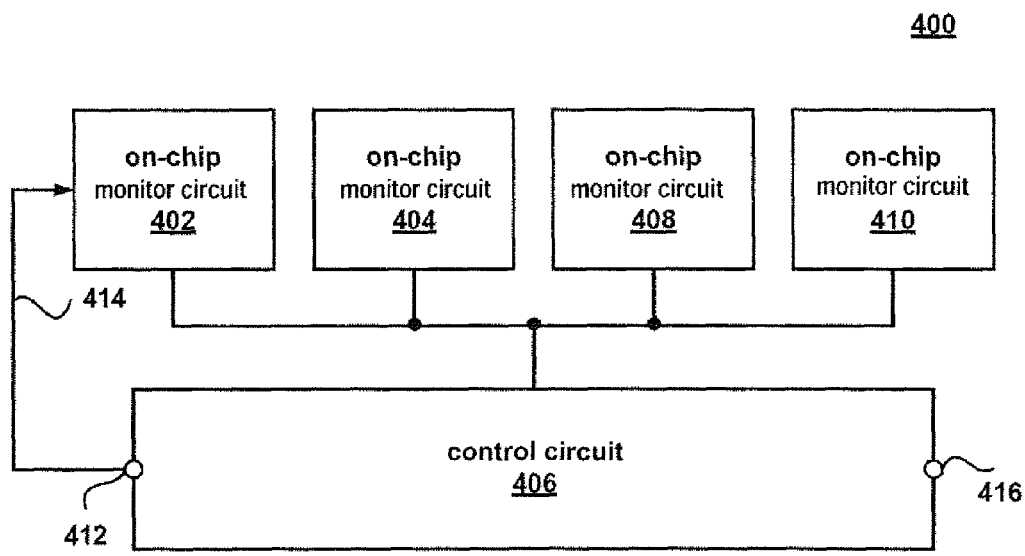
FIG. 4 illustrates a further exemplary circuit arrangement with a plurality of on-chip monitor circuits and a controller.

FIG. 4 shows a schematic circuit diagram of a further exemplary circuit arrangement 400 that includes a plurality of on-chip monitor circuits 402, 404, 408 and 410 and a controller 406. The plurality of on-chip monitor circuits 402, 404, 408 and 410 is arranged in a network and each of the plurality of on-chip monitor circuits 402, 404, 408 and 410 may be coupled to all the other of the plurality of on-chip monitor circuits 402, 404, 408 and 410. The controller 406 is coupled to the network of on-chip monitor circuits 402, 404, 408 and 410 and is configured to receive measurement results from them. The controller 406 is further configured to generate an output 412 in accordance with an evaluation of the measurement results. At least one feedback loop 414 is coupled to the controller 406 and the network. The at least one feedback loop 414 is configured to control a calibration of at least one 402 of the plurality of on-chip monitor circuits 402, 404, 408 and 410 in accordance with the output 412.

Each of the plurality of on-chip monitor circuits 402, 404, 408 and 410 may be configured to measure one or several parameters of the semiconductor chip, as described in connection with FIG. 1 earlier herein. The controller 406 may provide the output 412 based on a combination of the measurement results received from the plurality of on-chip monitor circuits 402, 404, 408 and 410.

In one implementation, one of the plurality of on-chip monitor circuits 402, 404, 408 and 410 may be an on-chip monitor circuit to be calibrated 402. The remaining on-chip monitor circuits 404, 408 and 410 may supervise the calibration of the on-chip monitor circuit to be calibrated 402. For example, the on-chip monitor circuit to be calibrated 402 may be a temperature monitor, the first supervising on-chip monitor circuit 404 may be a supply voltage monitor, the second supervising on-chip monitor circuit 408 may be a process monitor and the third supervising on-chip monitor circuit 410 may be an aging monitor. During a calibration phase of the temperature monitor to be calibrated 402, each of the supervising on-chip monitor circuits 404, 408 and 410 may provide measurement results to the controller 406. The controller 406 may combine the measurement results received from the supervising on-chip monitor circuits 404, 408 and 410. For example, the controller 406 may check if the supply voltage deviates from a predetermined voltage range and it may take into account the status of the semiconductor chip with respect to process and aging. Generally, by way of the supervising on-chip monitor circuits 404, 408 and 410, the controller 406 may detect variations of operating conditions during the calibration phase of the temperature monitor to be calibrated 402. Depending on the measurement results received, the controller 406 may denote the calibration of the temperature monitor to be calibrated 402 as valid or invalid.

The controller 406 may provide a signal at the output 412 based on a combination of the measurement results received from the supervising on-chip monitor circuits 404. 408 and 410. The signal at the output 412 may be provided to the network of on-chip monitor circuits 402, 404, 408 and 410 via the feedback loop 414. The feedback loop 414 may control the calibration of the temperature monitor to be calibrated 402. For example, the controller 406 may initiate a re-start of a calibration of the temperature monitor to be calibrated 402 via the feedback loop 414. By combining measurement data obtained from multiple monitor sources 404, 408 and 410, the calibration accuracy of the on-chip monitor circuit to be calibrated 402 may be improved.

The circuit arrangement 400 as illustrated and described in connection with FIG. 4 comprises just one feedback loop 414. In one implementation, the circuit arrangement 400 may comprise multiple feedback loops. For example, each of the plurality of on-chip monitor circuits 402, 404, 408 and 410 may be coupled to the controller 406 via a feedback loop. The controller 406 may control a calibration of each of the plurality of on-chip monitor circuits 402, 404, 408 and 410 via the feedback loop and a supervised calibration of some or all of the plurality of on-chip monitor circuits 402, 404, 408 and 410 may be performed consecutively or concurrently.

In one implementation, the circuit arrangement 400 may comprise a network of autonomously working on-chip monitor circuits 402, 404, 408 and 410. The controller 406 may control an operation of the network of autonomously working on-chip monitor circuits 402, 404, 408 and 410. The on-chip monitor circuits 402, 404, 408 and 410 may operate independently from each other. For example, the controller 406 may start or re-start a calibration of the network of autonomously working on-chip monitor circuits 402, 404, 408 and 410. The calibration of the network of autonomously working on-chip monitor circuits 402, 404, 408 and 410 may be performed without any further interaction.

Referring to FIGS. 1 and 4, a calibration of the on-chip monitor circuit to be calibrated 102 and 104 may be performed during production of the semiconductor chip that contains the on-chip monitor circuit to be calibrated 102 and 104. For example, the calibration may be performed before and/or after packaging of the semiconductor chip. Additionally or alternatively, the calibration of the on-chip monitor circuit to be calibrated 102 and 104 may be performed during runtime. For example, the calibration may be performed at every set or reset of the semiconductor chip and/or at every change of operating conditions of the semiconductor chip, such as a change of the supply voltage VDD or the clock frequency.

Referring to FIGS. 1 and 4, in one implementation, the plurality of on-chip monitor circuits 102 and 104 and the network of on-chip monitor circuits 402, 404, 408 and 410, respectively, may be configured to be operated simultaneously, i.e., they may be configured to measure parameters of the semiconductor chip simultaneously. For example, referring to FIG. 4, during the calibration of the temperature monitor 402, the temperature monitor 402, the supply voltage monitor 404, the process monitor 408 and the aging monitor 410 may operate at the same time. The controller 406 may start the network of on-chip monitor circuits 402, 404, 408 and 410 at the same time and the network of on-chip monitor circuits 402, 404, 408 and 410 may be active at the same time. The on-chip monitor circuits 404, 408 and 410 may have different measurement times. For example, the aging monitor 410 may have a longer measurement time than the supply voltage monitor 404. Therefore, although the measurement phases of the on-chip monitor circuits 404, 408 and 410 may start at the same time, the end of the measurement phases may be different.

Referring to FIGS. 1 and 4, in one implementation, at least two on-chip monitor circuits of the plurality of on-chip monitor circuits 102 and 104 and of the network of on-chip monitor circuits 402, 404, 408 and 410, respectively, may be of the same type. For example, at least two on-chip monitor circuits may measure a same parameter of the semiconductor chip. Additionally or alternatively, at least two on-chip monitor circuits may be constructed in a same or similar manner. For example, on-chip monitor circuits 402 and 404 may be temperature monitors and on-chip monitor circuits 408 and 410 may be supply voltage monitors located.

In one implementation, the plurality of on-chip monitor circuits 102 and 104 and the network of on-chip monitor circuits 402, 404, 408 and 410, respectively, may be arranged in various regions of the semiconductor chip and may form a monitoring system. For example, the at least two on-chip monitor circuits of the same type may be arranged in various regions of the semiconductor chip. At least two on-chip monitor circuits may measure a temperature of the semiconductor chip and they may be placed at different locations on the semiconductor chip as portions of the semiconductor chip may run at different localized temperatures. Additionally or alternatively, at least two on-chip monitor circuits may measure a supply voltage of the semiconductor chip at different locations of the semiconductor chip as parts of the semiconductor chip may be operated at different local supply voltages.

Each of the plurality of on-chip monitor circuits 102 and 104 as illustrated and described in connection with FIG. 1 and each on-chip monitor circuit of the network of on-chip monitor circuits 402, 404, 408 and 410 as illustrated and described in connection with FIG. 4 may be implemented in a dedicated circuit block. Additionally or alternatively, the controller 106 and 406 may be implemented as a dedicated circuit or it may be implemented in a processor. For example, the controller 106 and 406 may be implemented in a programmable microcontroller, a digital signal processor or an application-specific processor that is equipped with a local memory.

The plurality of on-chip monitor circuits 102 and 104 and the network of on-chip monitor circuits 402, 404, 408 and 410 as illustrated and described in connection with FIGS. 1 and 4 may be self-calibrating. As described in connection with FIGS. 1 and 4, the controller 106 and 406 may start a calibration of a self-calibrating on-chip monitor circuit 102 and 402. If the calibration is invalid, the controller 106 and 406 may initiate a re-start of the calibration. Otherwise, the calibration is valid and finished. Except for the start and the re-start, respectively, the controller 106 and 406 may not affect the operation of the self-calibrating on-chip monitor circuit 102 and 402.

Figure 5:
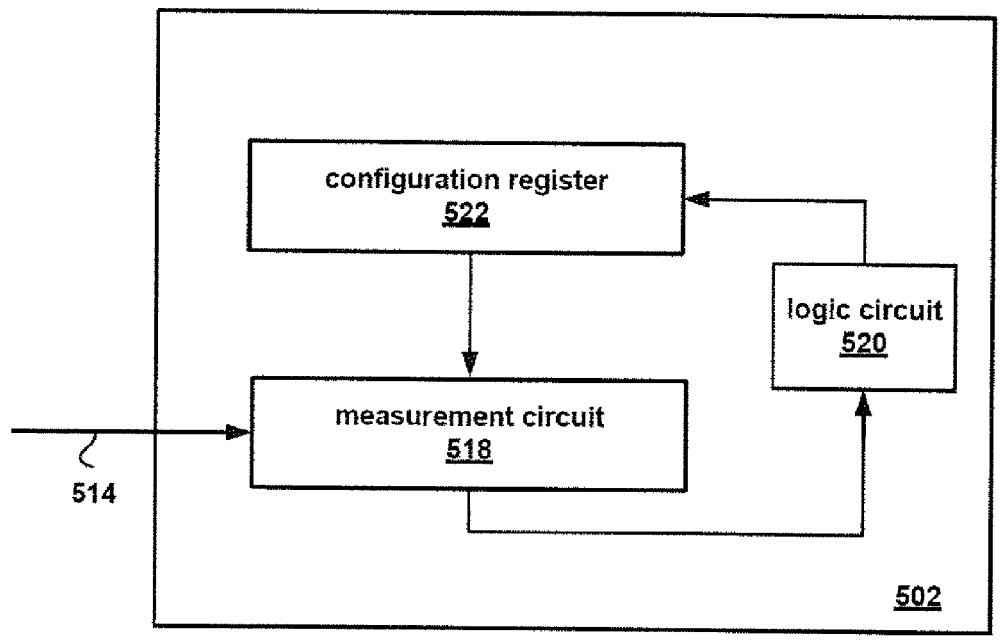
FIG. 5 illustrates an exemplary self-calibrating on-chip monitor circuit.

FIG. 5 illustrates a schematic circuit diagram of a self-calibrating on-chip monitor circuit 502. The self-calibrating on-chip monitor circuit 502 includes a measurement circuit 518, a logic circuit 520 and a configuration register 522. The configuration register 522 is coupled to the measurement circuit 518 and may control an operation of the measurement circuit 518. The measurement circuit 518 may receive a control signal 514 that may be provided by a controller like, e.g., the controller 106 of FIG. 1 or the controller 406 of FIG. 4. The control signal 514 may initiate a start or re-start of a calibration by starting or re-starting a measurement of a chip parameter within the measurement circuit 518. The logic circuit 520 is coupled to the measurement circuit 518 and the configuration register 522. The logic circuit 520 may receive a measurement result of a chip parameter from the measurement circuit 518 and it may control a setting of the configuration register 522 responsive to the measurement result received. For example, the measurement circuit 518 may include an internal delay line and a tapping within the internal delay line may be adjusted in accordance with the setting of the configuration register 522. The calibration of the self-calibrating on-chip monitor circuit 502 may be performed by measuring the chip parameter several times and by adjusting the setting of the configuration register 522 several times. Generally, after a start or re-start of a calibration of the self-calibrating on-chip monitor circuit 502, the calibration may be performed and completed without any inter-action with further circuits outside the self-calibrating on-chip monitor circuit 502.

Alternatively, the plurality of on-chip monitor circuits 102 and 104 and the network of on-chip monitor circuits 402, 404, 408 and 410 as illustrated and described in connection with FIGS. 1 and 4 may be on-chip monitor circuits with external calibration. In contrast to a self-calibrating on-chip monitor circuit, an on-chip monitor circuit with external calibration may inter-act with circuits outside the on-chip monitor circuit several times within a calibration phase.

Figure 6:
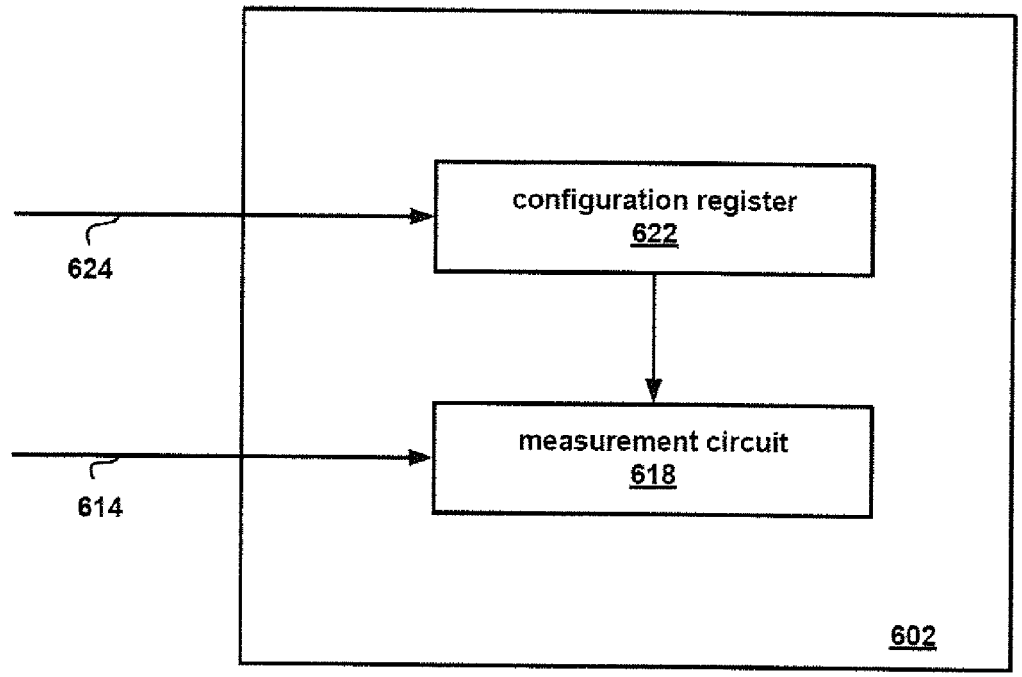
FIG. 6 illustrates an exemplary on-chip monitor circuit with external calibration.

FIG. 6 illustrates a schematic circuit diagram of an on-chip monitor circuit with external calibration 602. The on-chip monitor circuit with external calibration 602 includes a measurement circuit 618 and a configuration register 622, herein called calibration control word 622. A control signal 614 may initiate a start or re-start of a calibration by starting or re-starting a measurement of a chip parameter within the measurement circuit 618. The measurement circuit 618 is coupled to the calibration control word 622 that may configure a setting of the measurement circuit 618. A setting of the calibration control word 622 may be controlled by a signal 624. The signal 624 may be provided by a controller like, e.g., the controller 106 of FIG. 1 or the controller 406 of FIG. 4. That means, the controller may control the calibration of the on-chip monitor circuit with external calibration 602 by adapting a setting of the calibration control word 622. For example, referring to FIG. 4, the feedback loop 414 may control the calibration by adapting the calibration control word 622 in accordance with the output 412. During calibration of the on-chip monitor circuit with external calibration 602, the calibration control word 622 may be updated several times.

Generally, a calibration of the plurality of on-chip monitor circuits 102 and 104 and the network of on-chip monitor circuits 402, 404, 408 and 410 as illustrated and described in connection with FIGS. 1-6 may be performed by adapting the monitor functionality by modifying the configuration register 522 and 622 as illustrated and described in connection with FIGS. 5 and 6. As described in connection with FIG. 5 earlier herein, an internal delay line may be adjusted in accordance with the setting of the configuration register 522 and 622. Additionally or alternatively, a measurement range, a measurement resolution, a measurement time, an internal data flow, an internally, locally generated voltage, an internally, locally generated current, an internal, local capacitance, an internal resistance, an internal frequency or an internal phase difference within an on-chip monitor circuit may be adjusted.

Each of the plurality of on-chip monitor circuits 102 and 104 and the network of on-chip monitor circuits 402, 404, 408 and 410 as illustrated and described in connection with FIGS. 1 and 4 may be operated in one of three different modes, a calibration mode, a measurement mode or a disabled mode. In the disabled mode, a power supply of at least one on-chip monitor circuit 102, 104, 402, 404, 408 and 410 may be disabled in order to save power.

The circuit arrangement 100 and 400 as illustrated and described in connection with FIGS. 1 and 4 may be operated in one of two different modes, a supervised calibration mode and a supervised measurement mode. In the supervised calibration mode, the circuit arrangement 100 and 400 may operate as illustrated and described in connection with FIGS. 1-6. The on-chip monitor circuit to be supervised 102 and 402 may operate in the calibration mode and the supervising on-chip monitor circuits 104, 404, 408 and 410 may operate in the measurement mode.

In the following, the supervised measurement mode will be described in connection with FIG. 4. However, it is to be noted that the supervised measurement mode may also be applied to the circuit arrangement 100 as illustrated and described in connection with FIG. 1. In the supervised measurement mode, each of the plurality of on-chip monitor circuits 402, 404, 408 and 410 may operate in the measurement mode. During a measurement phase, one 402 of the plurality of on-chip monitor circuits 402, 404, 408 and 410, herein called characterizing on-chip monitor circuit 402, may provide measurement results of a chip parameter to be measured or characterized, respectively. The other on-chip monitor circuits 404, 408 and 410 of the plurality of on-chip monitor circuits 402, 404, 408 and 410, herein called supervising on-chip monitor circuits 404, 408 and 410, may provide measurement results of chip parameters to be supervised during the measurement phase.

The controller 406 may receive the measurement results from the characterizing on-chip monitor circuit 402 and from the supervising on-chip monitor circuits 404, 408 and 410. The controller 406 may combine the measurement results received from the supervising on-chip monitor circuits 404, 408 and 410. For example, the controller 406 may detect if at least one of the measurement results received from the supervising on-chip monitor circuits 404, 408 and 410 deviates from a predetermined range. The controller 406 may denote the measurement results received from the characterizing on-chip monitor circuit 402 as invalid if at least one of the measurement results of the supervising on-chip monitor circuits 404, 408 and 410 deviates from the predetermined range and it may initiate a repeat of the measurement phase. If none of the measurement results of the supervising on-chip monitor circuits 404, 408 and 410 deviates from the predetermined range the measurement results received from the characterizing on-chip monitor circuit 402 may be denoted as valid and the measurement phase may be finished.

The controller 406 may provide a further output 416 in accordance with a combined evaluation of the measurement results received from the plurality of one on-chip monitor circuits 402, 404, 408 and 410. A signal may be provided at the further output 416 if the measurement results received from the characterizing on-chip monitor circuit 402 are denoted as valid. A further circuit may receive the signal provided at the further output 416 and the further circuit may adapt a parameter of the semiconductor chip responsive to the signal. The parameter to be adapted may be one of the parameters listed in connection with FIG. 1 earlier herein. Generally, the controller 406 is configured to adapt a parameter of the semiconductor chip in accordance with a combination of the measurement results received from the plurality of one on-chip monitor circuits 402, 404, 408 and 410 if the measurement results received from the characterizing on-chip monitor circuit 402 are denoted as valid.

For example, in the supervised measurement mode, a supervised measurement of a temperature of the semiconductor chip or of a part of the semiconductor chip, respectively, may be performed. The characterizing on-chip monitor circuit 402 may be a temperature monitor, the supervising on-chip monitor circuit 404 may be a supply voltage monitor, the supervising on-chip monitor circuit 408 may be an aging monitor and the supervising on-chip monitor circuit 410 may be a process monitor. During a measurement phase of the temperature, the controller 406 may receive measurement results from the characterizing temperature monitor 402. In addition, the controller 406 may collect measurement results from the supervising on-chip monitor circuits 404, 408 and 410. The controller 406 may check for each of the measurement results received from the supervising on-chip monitor circuits 404, 408 and 410 if they deviate from a predetermined range. If none of the measurement results received from the supervising monitor circuits 404, 408 and 410 deviates from the predetermined range, the measurement results received by the temperature monitor 402 may be denoted as valid. Otherwise, the measurement results received by the temperature monitor 402 may be denoted as invalid.

For example, by way of the supply voltage monitor 404, the controller 406 may detect a sudden ir-drop that may take place during the measurement phase of the temperature and that may corrupt the measurement performed by the temperature monitor 402. In case of a sudden ir-drop, the measurement results received from the temperature monitor 402 may be denoted as invalid. If the measurement results received from the temperature monitor 402 are denoted as valid, the controller 406 may provide a signal at the further output 416 that may correspond to the temperature measured during the measurement phase. A further circuit may receive the signal provided at the further output 416 and the further circuit may adapt, e.g., a clock frequency of the semiconductor chip according to the signal. For example, the further circuit may decrease a frequency of a clock of the semiconductor chip if the temperature measured by the temperature monitor 402 has been increased. If the CMOS circuit performance decreases with decreasing temperature, as for example in modern CMOS technologies with minimum features sizes below 65 nm, i.e. 45 nm node or 28 nm node, or at ultra-low VDD operation with VDD less than 1V, the further circuit may decrease the frequency or may increase the supply voltage in order to prevent a system crash. Generally, the further circuit may initiate a countermeasure in accordance with the signal received from the further output 416.

Generally, in the supervised measurement mode, the controller 406 may determine a status of the semiconductor chip based on the measurement results received from the characterizing on-chip monitor circuit 402 and the supervising on-chip monitor circuits 404, 408 and 410. A signal that is provided at the further output 416 may correspond to the status of the semiconductor chip. A further circuit may be coupled to the further output 416 of the semiconductor circuit 400 and the further circuit may change the status of the semiconductor chip responsive to the signal received from the further output 416. By supervising one or several chip parameters during a measurement phase of a chip parameter to be characterized, an accurate measurement of the chip parameter to be characterized may be allowed for. It may be detected if substantial, temporal variations of the chip parameters to be supervised disturb the measurement of the chip parameter to be characterized. Therefore, it may be prevented that the status of the semiconductor chip may be changed erroneously.

The controller 406 may compute the status of the semiconductor chip according to a predefined algorithm. For example, as described in connection with FIG. 4 earlier herein, the controller 406 may check if the measurement results received from supervising on-chip monitor circuits 404, 408 and 410 deviate from a predetermined range. Additionally or alternatively, the controller 406 may apply a different algorithm to the measurement results received from the plurality of on-chip monitor circuits 402, 404, 408 and 410. For example, the controller 406 may perform an averaging of the measurement results and/or it may compare the measurement results to a predetermined threshold value.

The further circuit may be implemented on the same semiconductor chip as the plurality of on-chip monitor circuits 402, 404, 408 and 410, i.e., they may be implemented on a same silicon substrate. Alternatively, the further circuit may be implemented on a different semiconductor chip or silicon substrate, respectively. The further circuit may include at least one of a power management circuit, a clock generator, a clock gating circuit, a programmable delay in clock and combinational logic paths and/or a wakeup circuitry of a computational circuit. The further circuit may change the status of the semiconductor chip by changing at least one of a supply voltage, a substrate voltage of an NFET and/or a PFET transistor, a clock frequency and a propagation delay in clock and combinational logic paths. Additionally or alternatively, the further circuit may change the status of the semiconductor chip by blocking the propagation of clock edges into a block and/or by activating an additional computational circuit.

As described in connection with FIGS. 1 and 4 earlier herein, during a measurement phase or a calibration phase, each on-chip monitor circuit of the plurality of on-chip monitor circuits 102 and 104 and the network of on-chip monitor circuits 402, 404, 408 and 410 may provide several measurement results to the controller 106 and 406. Alternatively, at least one of the plurality of on-chip monitor circuits 102 and 104 and the network of on-chip monitor circuits 402, 404, 408 and 410 may provide just one measurement result to the controller 106 and 406 during a measurement phase or a calibration phase. The controller 106 and 406 may combine the one or several measurement results received from the plurality of on-chip monitor circuits 102 and 104 and the network of on-chip monitor circuits 402, 404, 408 and 410.

Figure 7:
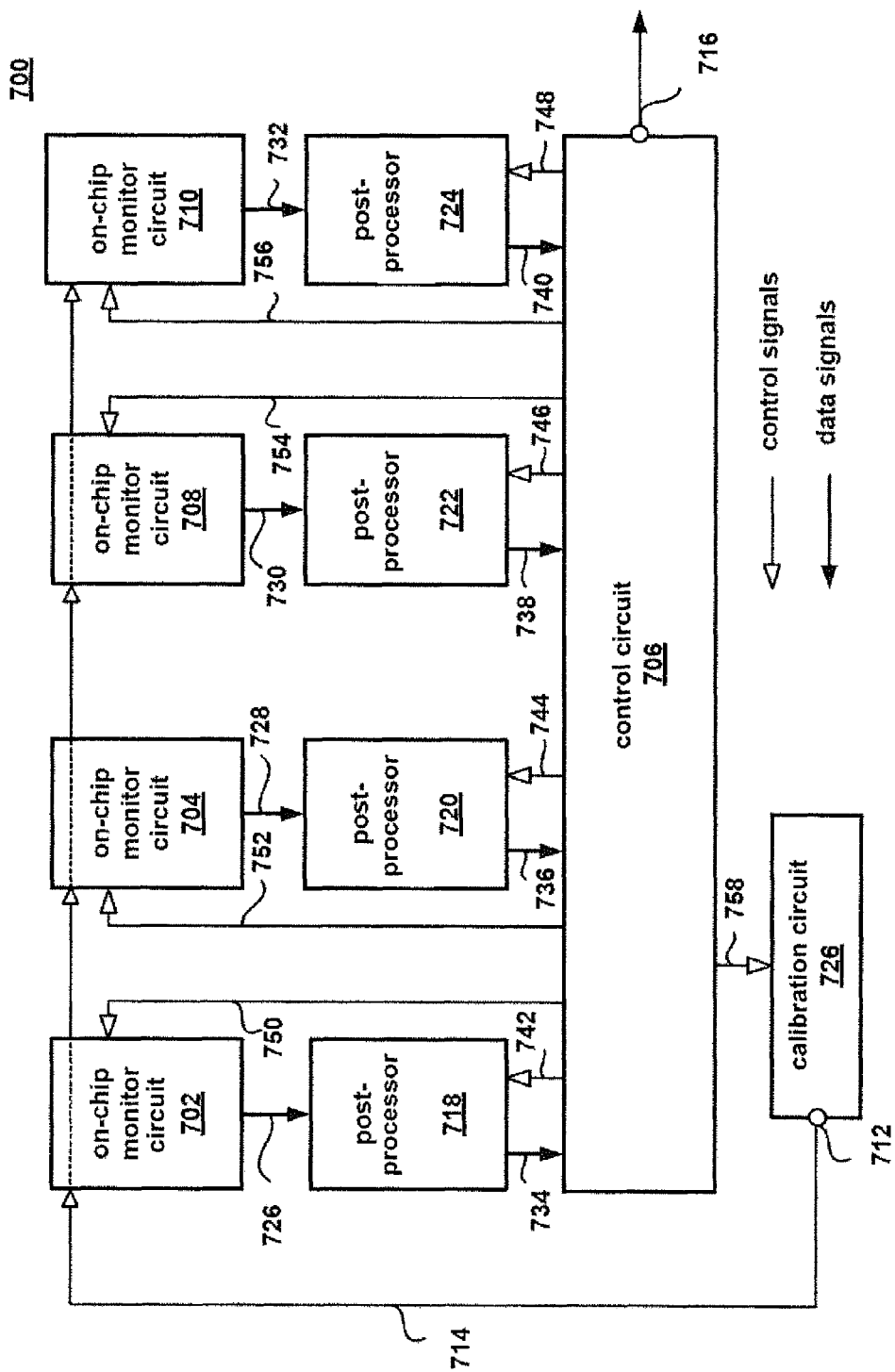
FIG. 7 illustrates an exemplary circuit arrangement with a plurality of on-chip monitor circuits, a controller and a plurality of post-processors.

FIG. 7 shows a further exemplary circuit arrangement 700 that includes a plurality of on-chip monitor circuits 702, 704, 708 and 710 and a controller 706. Additionally, the circuit arrangement 700 includes a plurality of post-processors 718, 720, 722 and 724 and a calibration circuit 726. Each of the post-processors 718, 720, 722 and 724 may be coupled to a dedicated on-chip monitor circuit 702, 704, 708 and 710. Each of the post-processors 718, 720, 722 and 724 may receive measured raw data 726, 728, 730 and 732 from the dedicated on-chip monitor circuit 702, 704, 708 and 710 and may perform a data conversion into a digital data output 734, 736, 738 and 740. The digital data output 734, 736, 738 and 740 of each of the post-processors 718, 720, 722 and 724 may be provided to the controller 706. The data conversion within the post-processors 718, 720, 722 and 724 may include at least one of an analog-to-digital conversion, a comparison, a look-up-table functionality and a signal processing functionality, such as filtering, average value computation, minimum and maximum operation or arithmetic-logic operations.

The plurality of post-processors 718, 720, 722 and 724 may be coupled to the controller 706 and an operation of the plurality of post-processors 718, 720, 722 and 724 may be controlled by post-processing control signals 742, 744, 746 and 748 provided by the controller 706. For example, the controller 706 may configure a mode of operation of the plurality of post-processors 718, 720, 722 and 724 via the post-processing control signals 742, 744, 746 and 748.

The controller 706 may further provide monitor control signals 750, 752, 754 and 756 to the plurality of on-chip monitor circuits 702, 704, 708 and 710 and it may control an operation of the plurality of on-chip monitor circuits 702, 704, 708 and 710 via the monitor control signals 750, 752, 754 and 756. For example, the controller 706 may start, stop or reset the plurality of on-chip monitor circuits 702, 704, 708 and 710 or it may set the plurality of on-chip monitor circuits 702, 704, 708 and 710 in one of a calibration mode, a measurement and a disabled mode.

The controller 706 may provide an output signal 716 corresponding to the chip status. Output signal 716 may be determined by a combined evaluation of the post-processed measurement results 734, 736, 738 and 740 of the plurality of on-chip monitor circuits 702, 704, 708 and 710.

The calibration circuit 726 may be coupled to the controller 706 and to the plurality of on-chip monitor circuits 702, 704, 708 and 710 and it may control an operation of the plurality of on-chip monitor circuits 702, 704, 708 and 710 during a calibration phase. The calibration circuit 726 may receive a calibration control signal 758 from the controller 706 and it may receive information regarding a start or stop of a calibration or a calibration being valid or invalid via the control signal 758. At an output 712, the calibration circuit 726 may provide a control signal to the plurality of on-chip monitor circuits 702, 704, 708 and 710 via a feedback loop 714. The calibration circuit 726 may initiate a start or re-start of a calibration of at least one of the plurality of on-chip monitor circuits 702, 704, 708 and 710 via the feedback loop 714.

As illustrated in FIG. 7, each of the post-processors 718, 720, 722 and 724 may be coupled to a dedicated on-chip monitor circuit 702, 704, 708 and 710. Alternatively, at least two of the plurality of on-chip monitor circuit 702, 704, 708 and 710 may be coupled to a common post-processor.

Implementations as illustrated and described in connection with FIGS. 1-7 may allow for an accurate calibration of on-chip monitor circuits and an accurate measurement of chip parameters despite of transient variations of operating conditions. The circuit arrangements 100, 400 and 700 as illustrated and described in connection with FIGS. 1-7 may detect the variations and may repeat the calibration or the measurement, respectively. All or most part of the circuit arrangements 100, 400 and 700 may be implemented digitally. Therefore, implementations of the circuit arrangements 100, 400 and 700 may only require a small area and a power consumption of the circuit arrangements 100, 400 and 700 may be low.

Features of the implementations as illustrated and described in connection with FIGS. 1-7 may be combined, unless specifically noted otherwise. For example, in one implementation, the circuit arrangement 100 of FIG. 1 may include more than two on-chip monitor circuits and/or the on-chip monitor circuits of the circuit arrangement 100 may be linked to each other similar to the circuit arrangement 400 as illustrated and described in connection with FIG. 4. In a further implementation, the plurality of on-chip monitor circuits 402, 404, 408 and 410 as illustrated and described in connection with FIG. 4 may not be linked to each other similar to the circuit arrangement 100 as illustrated and described in connection with FIG. 1.

Figure 8:
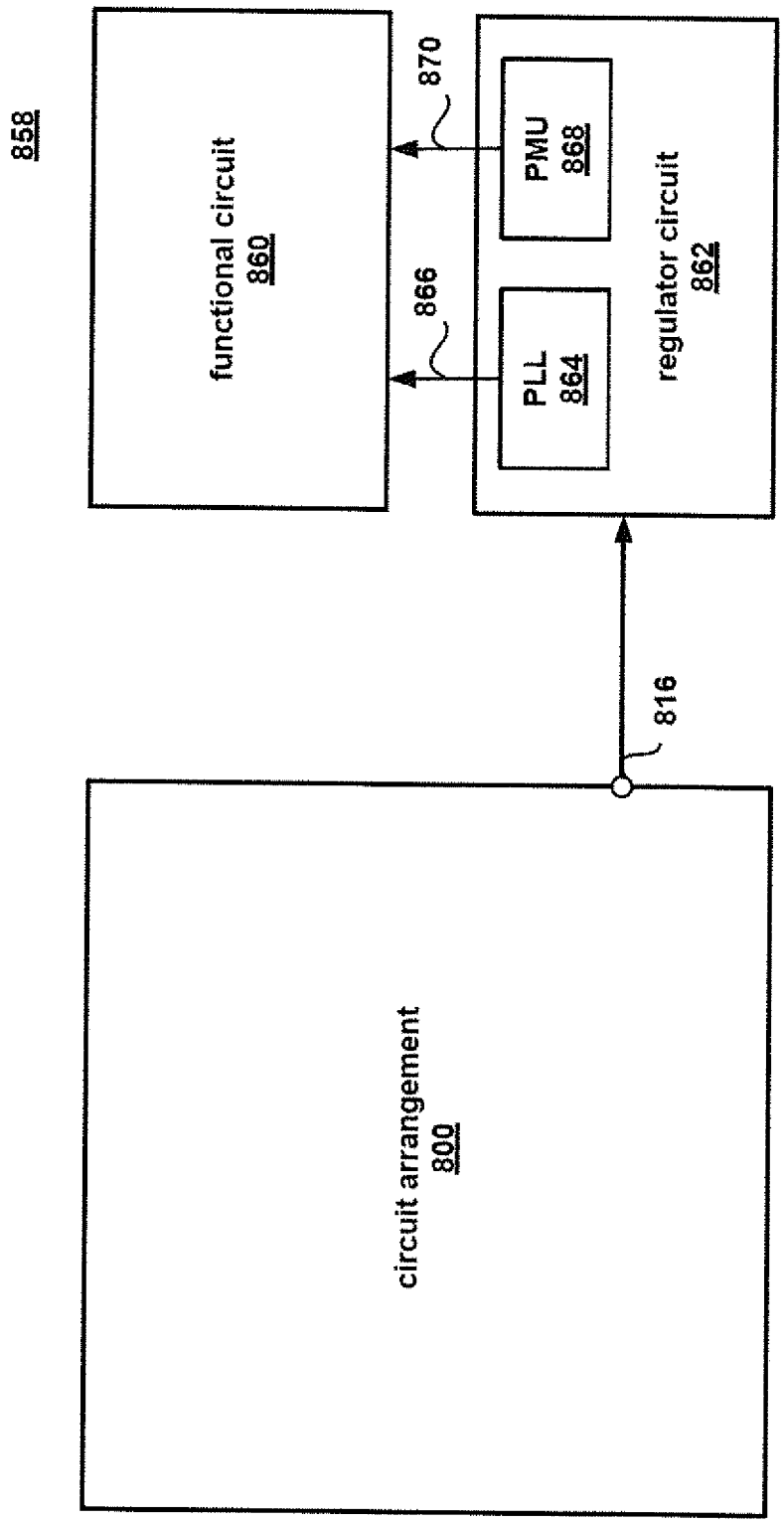
FIG. 8 illustrates an exemplary system with a circuit arrangement, a functional circuit and a regulator circuit.

FIG. 8 shows a system 858 that includes a circuit arrangement 800, a functional circuit 860 and a regulator circuit 862. The circuit arrangement 800 may include one of the circuit arrangements as illustrated and described in connection with FIGS. 1-7 earlier herein. The circuit arrangement 800 may be coupled to the regulator circuit 862 and it may provide a signal at an output 816 to the regulator circuit 862. As described in connection with FIG. 4, the signal provided at the output 816 may correspond to a status of a semiconductor chip.

As illustrated in FIG. 8, the regulator circuit 862 may be coupled to the functional circuit 860 and the functional circuit 860 may perform at least part of a function of a semiconductor chip. For example, the functional circuit 860 may perform arithmetic operations or storing operations. The regulator circuit 862 may include a phase-locked loop (PLL) 864 and it may provide a clock signal 866 to the functional circuit 860. Additionally or alternatively, the regulator circuit 862 may include a power management circuit (PMU) 868 and it may provide a supply voltage signal 870 to the functional circuit 860. The regulator circuit 862 may adapt a frequency provided via the clock signal 866 and a voltage level provided via the supply voltage signal 870 responsive to the signal provided at the output 816 of the circuit arrangement 800.

In one implementation, the circuit arrangement 800 and the functional circuit 860 may be arranged on a same semiconductor chip, i.e., they may be implemented on a same silicon substrate. During a measurement phase, the circuit arrangement 800 may determine a current status of the semiconductor chip and it may provide a signal at the output 816 that corresponds to the current status of the semiconductor chip. The regulator circuit 862 may regulate a parameter of the semiconductor chip responsive to the signal received from the output 816 of the circuit arrangement 800. The regulator circuit 862 may adapt the parameter of the semiconductor chip by changing a feature of at least one of the signals 866 and 870 provided to the functional circuit 860 For example, if the circuit arrangement 800 determines an increase of a temperature, the regulator circuit 862 may decrease a frequency of the clock signal 866 provided to the functional circuit 860.

By placing the circuit arrangement 800 and the functional circuit 860 on the same semiconductor chip, the circuit arrangement 800 and the functional circuit 860 may both encounter the same operating conditions. In one implementation, the on-chip monitor circuits of the circuit arrangement 800 may include similar CMOS circuits as the functional circuit 860 and effects acting on the functional circuit 860 may also act on the on-chip monitor circuits of the circuit arrangement 800. The regulator circuit 862 may be implemented on the same semiconductor chip as the circuit arrangement 800 and the functional circuit 860. Alternatively, the regulator circuit 862 may be implemented on a different semiconductor chip.

In addition to the signals as illustrated in FIG. 8, the functional circuit 860 may provide information to the circuit arrangement 800. For example, the functional circuit 860 may provide information concerning running applications and/or performance requirements to the circuit arrangement 800. Additionally or alternatively, the regulator circuit 862 may provide information to the circuit arrangement 800. For example, the regulator circuit 862 may provide information concerning operation conditions, e.g., upper/lower supply voltage range, to the circuit arrangement 800. The circuit arrangement 800 may provide the signal at the output 816 in accordance with the information received from the functional circuit 860 and the regulator circuit 862. Generally, the circuit arrangement 800 may be able to account for information provided by the system environment in which it is implemented. Therefore, the circuit arrangement 800 may be implemented flexibly.

Exemplary Methods

Figure 9:
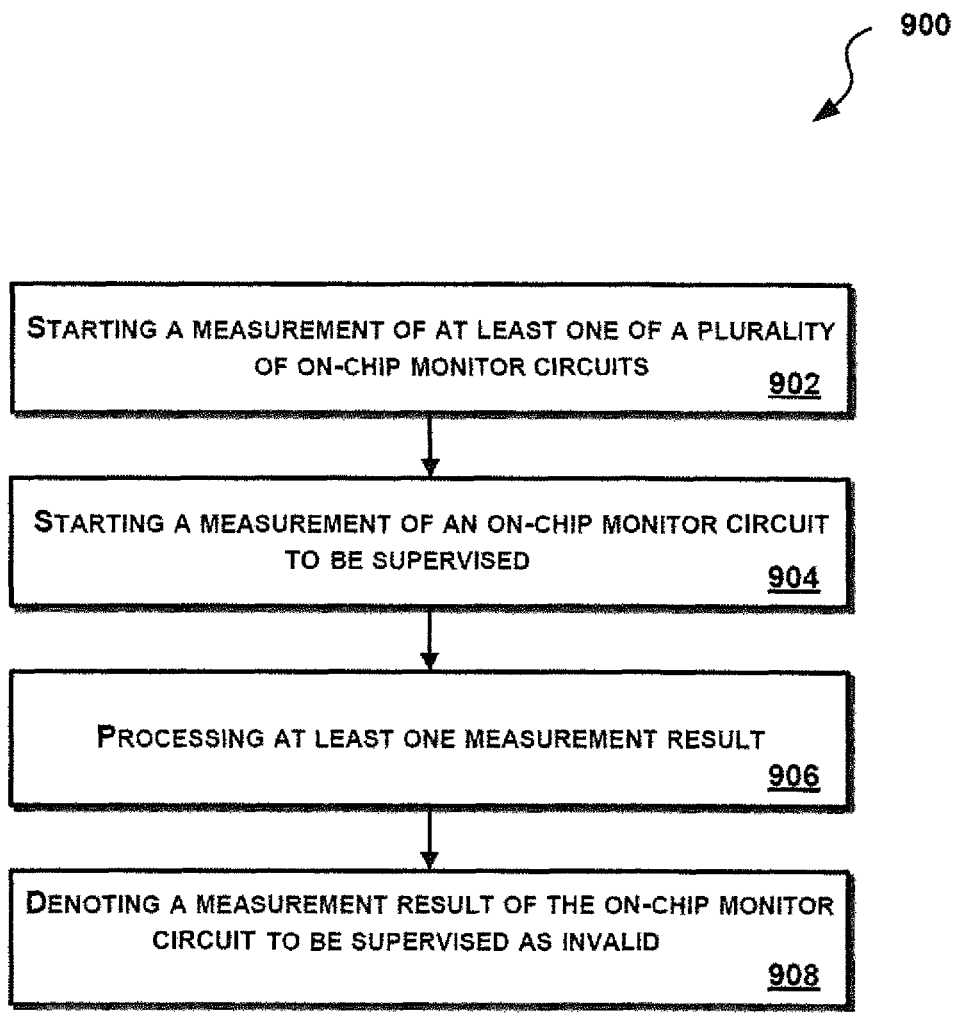
FIG. 9 illustrates a flow diagram that includes a number of operations supervising an on-chip monitor circuit.
Figure 10:
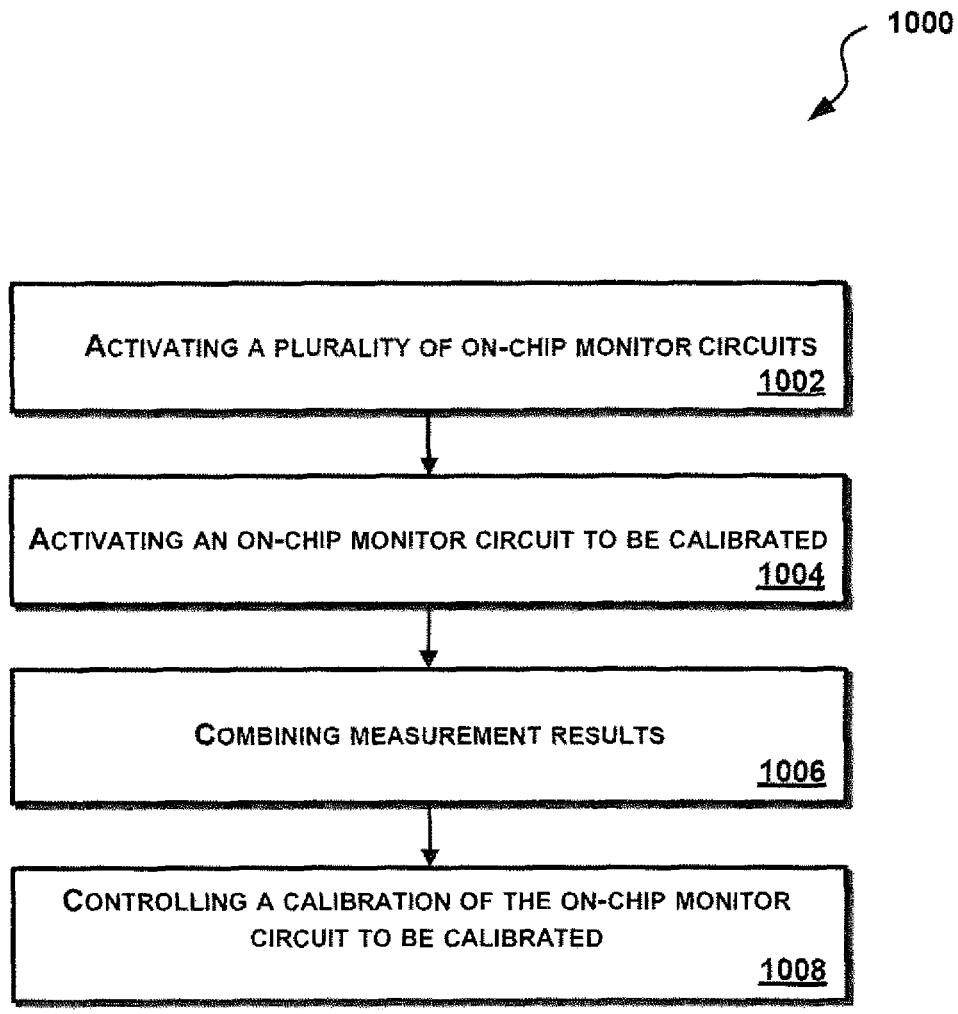
FIG. 10 illustrates a flow diagram that includes a number of operations calibrating an on-chip monitor circuit.

FIG. 9 illustrates a flow diagram 900 that includes a number of operations supervising an on-chip monitor circuit. FIG. 10 illustrates a flow diagram 1000 that includes a number of operations calibrating an on-chip monitor circuit. Unless stated otherwise, the order in which the operations are described is not intended to be construed as a limitation. Operations may be repetitive, may be combined in any order and/or may be in parallel to implement the process. In portions of the following discussion, reference may be made to the illustrations of FIGS. 1-8 and the subject matter thereof. The procedures described in connection with FIGS. 9 and 10 may be realized utilizing the previously described implementations.

Referring to FIG. 9, at block 902, a measurement of at least one of a plurality of on-chip monitor circuits is started. Each of the plurality of on-chip monitor circuits is configured to measure a parameter of a semiconductor chip. The at least one of a plurality of on-chip monitor circuits is herein called supervising on-chip monitor circuit. The supervising on-chip monitor circuit is configured to measure a parameter of the semiconductor chip, herein called parameter to be supervised.

At block 904, a measurement of an on-chip monitor circuit to be supervised is started. The on-chip monitor circuit to be supervised is configured to measure a parameter of the semiconductor chip, herein called parameter to be characterized.

At block 906, at least one measurement result from the supervising on-chip monitor circuit is processed. For example, the processing may include comparing the at least one measurement result from the supervising on-chip monitor circuit to a predetermined range.

At block 908, a measurement result of the on-chip monitor circuit to be supervised is denoted as invalid if the at least one measurement result from the supervising on-chip monitor circuit deviates from a predetermined range.

By supervising the parameter to be supervised during a measurement phase of a parameter to be characterized, an accurate measurement of the parameter to be characterized may be allowed for. It may be detected if variations of the chip parameters to be supervised disturb the measurement of the chip parameter to be characterized.

In one implementation, the on-chip monitor circuit to be supervised is configured to measure a parameter that is different from the parameters to be measured by the plurality of on-chip monitor circuits. That means, the parameter to be characterized may differ from the supervising parameters.

In a further implementation, the starting of the measurement of the on-chip monitor circuit to be supervised takes place temporally after the starting of the measurement of the supervising on-chip monitor circuit. Therefore, the supervising on-chip monitor circuit may already be measuring the parameter to be supervised at the point of time when the on-chip monitor circuit to be supervised may start measuring the parameter to be characterized.

In a further implementation, at least the steps of blocks 902-906 are repeated if the at least one measurement result of the on-chip monitor circuit to be supervised is denoted as invalid. The steps of blocks 902-906 may be repeated until the at least one measurement result of the on-chip monitor circuit to be supervised is denoted as valid. As soon as the at least one measurement result of the on-chip monitor circuit to be supervised is denoted as valid, the measurement of the on-chip monitor circuit to be supervised may be finished.

In a further implementation, a measurement mode is activated and a parameter of the semiconductor chip is adapted in accordance with the measurement result of the on-chip monitor circuit to be supervised if the measurement result of the on-chip monitor circuit to be supervised is not denoted as invalid. By adapting the parameter of the semiconductor chip, a status of the semiconductor chip may be changed. The status of the semiconductor chip may be changed based on the measurement result of the on-chip monitor circuit to be supervised. For example, a countermeasure may be triggered responsive to the measurement result of the on-chip monitor circuit to be supervised. However, the countermeasure may just be triggered if the measurement result of the on-chip monitor circuit to be supervised is denoted as valid. Therefore, an erroneous update of the status of the semiconductor chip may be prevented.

In a further implementation, a plurality of measurement results is received from the supervising on-chip monitor circuit within a predetermined period. The processing of the measurements results at block 906 includes processing of the plurality of measurement results. By processing a plurality of measurement results, the accuracy of the measurement of the chip parameter to be characterized may be improved.

Referring to FIG. 10, at block 1002, a plurality of on-chip monitor circuits is activated. The plurality of on-chip monitor circuits is configured to measure at least one parameter of a semiconductor chip and is herein called supervising on-chip monitor circuits.

At block 1004, an on-chip monitor circuit to be calibrated is activated.

At block 1006, measurement results from the supervising on-chip monitor circuits are combined. For example, the combining may include checking if each of the measurement results falls within a predetermined range.

At block 1008, a calibration of the on-chip monitor circuit to be calibrated is controlled in accordance with the combination of the measurement results.

By monitoring at least one parameter of the semiconductor chip during a calibration phase of the on-chip monitor circuit to be calibrated, an accurate calibration of the on-chip monitor circuit to be calibrated may be allowed for. It may be detected if substantial, temporal variations of the at least one parameter disturbing the calibration of the on-chip monitor circuit to be calibrated.

In one implementation, controlling the calibration includes adapting a setting of the on-chip monitor circuit to be calibrated. By adapting the setting, the functionality of the on-chip monitor circuit to be calibrated may be changed. For example, the functionality of the on-chip monitor circuit to be calibrated may be changed with respect to measurement properties of the on-chip monitor circuit to be calibrated.

In a further implementation, controlling the calibration includes repeating the activating steps of blocks 1002 and 1004 and the combining step of block 1006 if at least one of the measurement results deviates from a predetermined range. If at least one of the measurement results deviates from a predetermined range, the calibration of the on-chip monitor circuit to be calibrated may be denoted as invalid. If none of the measurement results from the plurality of on-chip monitor circuits deviated from a predetermined range, the calibration of the on-chip monitor circuit to be calibrated may be denoted as valid and finished. The activating steps of blocks 1002 and 1004 and the combining step of block 1006 may be repeated until the calibration of the on-chip monitor circuit to be calibrated is denoted as valid.

Conclusion

For the purposes of this disclosure and the claims that follow, the term "coupled" has been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims. It is within the scope of this disclosure to combine various features of the different implementations and claims to produce variations thereof.

What is claimed is:

1. A circuit arrangement, comprising:
   a plurality of on-chip monitor circuits, each of the plurality of on-chip monitor circuits configured to measure a parameter of a semiconductor chip; and
   a controller coupled to the plurality of on-chip monitor circuits, the controller configured to receive a measurement result from at least a supervising one of the plurality of on-chip monitor circuits and to control a calibration of another one of the plurality of on-chip monitor circuits in accordance with the measurement result;
   wherein the controller is configured to denote the calibration of said other one of the plurality of on-chip monitor circuits as invalid if the measurement result from the supervising one of the plurality of on-chip monitor circuits deviates from a predetermined range, the measurement result from the supervising one of the plurality of on-chip monitor circuits relating to a different parameter than the parameter said other one of the plurality of on-chip monitor circuits is configured to measure.

2. The circuit arrangement of claim 1, wherein at least two on-chip monitor circuits of the plurality of on-chip monitor circuits are of the same type.

3. The circuit arrangement of claim 1, wherein the plurality of on-chip monitor circuits are configured to measure parameters of the semiconductor chip simultaneously.

4. The circuit arrangement of claim 1, wherein the plurality of on-chip monitor circuits are arranged in various regions of the semiconductor chip.

5. The circuit arrangement of claim 1, wherein the controller is configured to control the calibration by adapting a setting of the another one of the plurality of on-chip monitor circuits.

6. The circuit arrangement of claim 1, wherein the controller is configured to repeat the calibration if the measurement result deviates from a predetermined range.

7. The circuit arrangement of claim 1, wherein the controller is configured to receive a plurality of measurement results from the at least one of the plurality of on-chip monitor circuits within a predetermined period and to control the calibration in accordance with a combination of the plurality of measurement results.

8. The circuit arrangement of claim 1, wherein the controller is configured to receive a plurality of measurement results from the plurality of on-chip monitor circuits and to detect if at least one of the plurality of measurement results deviates from a predetermined range.

9. The circuit arrangement of claim 8, wherein the controller is configured to adapt a parameter of the semiconductor chip in accordance with a combination of the plurality of measurement results if none of the plurality of measurement results deviates from a predetermined range.

10. A circuit arrangement, comprising:
    a plurality of on-chip monitor circuits arranged in a network, each of the plurality of on-chip monitor circuits configured to measure at least one parameter of a semiconductor chip;

a controller coupled to the network of on-chip monitor circuits, the controller configured to receive measurement results from the plurality of on-chip monitor circuits and to generate an output in accordance with an evaluation of the measurement results; and at least one feedback loop coupled to the controller and the network, the at least one feedback loop configured to control a calibration of at least one of the plurality of on-chip monitor circuits in accordance with the output; wherein the controller is configured to denote the calibration as invalid if at least one measurement result from a supervising one of the plurality of on-chip monitor circuits deviates from a predetermined range, the at least one measurement result relating to a different parameter than the parameter said at least one of the plurality of on-chip monitor circuits is configured to measure.

11. The circuit arrangement of claim 10, wherein the controller is further configured to adapt a parameter of the semiconductor chip in accordance with a combination of the measurement results.

12. The circuit arrangement of claim 10, wherein the at least one of the plurality of on-chip monitor circuits comprises a calibration control word and wherein the feedback loop is configured to control the calibration by adapting the calibration control word in accordance with the output.

13. The circuit arrangement of claim 10, wherein the network of the plurality on-chip monitor circuits is configured to be operated simultaneously.

14. The circuit arrangement of claim 10, wherein each of the plurality of on-chip monitor circuits is implemented in a dedicated circuit block and wherein the controller is implemented in a processor.

15. A method of supervising an on-chip monitor circuit, the method comprising:
  (a) starting a measurement of at least a supervising one of a plurality of on-chip monitor circuits, wherein each of the plurality of on-chip monitor circuits is configured to measure a parameter of a semiconductor chip;
  (b) starting a measurement of an on-chip monitor circuit to be supervised, wherein the on-chip monitor circuit to be supervised is configured to measure a parameter of the semiconductor chip;
  (c) processing at least one measurement result from the supervising one of the plurality of on-chip monitor circuits; and
  (d) denoting a measurement result of the on-chip monitor circuit to be supervised as invalid if the at least one measurement result from the supervising one of the plurality of on-chip monitor circuits deviates from a predetermined range, the at least one measurement result relating to a different parameter than the parameter the on-chip monitor circuit to be supervised is configured to measure.

16. The method of claim 15, wherein the starting of the measurement of the on-chip monitor circuit to be supervised takes place temporally after the starting of the measurement of the at least one of the plurality of on-chip monitor circuits.

17. The method of claim 15, further comprising repeating at least steps (a)–(c) if the at least one measurement result of the on-chip monitor circuit to be supervised is denoted as invalid.

18. The method of claim 15, further comprising activating a measurement mode and adapting a parameter of the semiconductor chip in accordance with the measurement result of the on-chip monitor circuit to be supervised if the measurement result of the on-chip monitor circuit to be supervised is not denoted as invalid.

19. The method of claim 15, further comprising receiving a plurality of measurement results from the at least one of the plurality of on-chip monitor circuits within a predetermined period, wherein the processing of the measurements results of step (c) includes processing of the plurality of measurement results.

20. A method of calibrating an on-chip monitor circuit, the method comprising:
  (a) activating a plurality of on-chip monitor circuits configured to measure at least one parameter of a semiconductor chip;
  (b) activating an on-chip monitor circuit to be calibrated;
  (c) combining measurement results from the plurality of on-chip monitor circuits;
  (d) controlling a calibration of the on-chip monitor circuit to be calibrated in accordance with the combination of the measurement results; and
  (e) denoting the calibration of the on-chip monitor circuit to be calibrated as invalid if at least one measurement result from a supervising one of the plurality of on-chip monitor circuits deviates from a predetermined range, the at least one measurement result from the supervising one of the plurality of on-chip monitor circuits relating to a different parameter than the on-chip monitor circuit to be calibrated is configured to measure.

21. The method of claim 20, wherein controlling the calibration includes adapting a setting of the on-chip monitor circuit to be calibrated.

22. The method of claim 20, wherein controlling the calibration includes repeating the first (a) and second (b) activating steps and the combining step (c) if at least one of the measurement results deviates from a predetermined range.

23. A system, comprising:
  a circuit arrangement comprising:
    a plurality of on-chip monitor circuits, each of the plurality of on-chip monitor circuits configured to measure a parameter of a semiconductor chip;
    a controller coupled to the plurality of on-chip monitor circuits, the controller configured to receive a measurement result from at least a supervising one of the plurality of on-chip monitor circuits and to control a calibration of another one of the plurality of on-chip monitor circuits in accordance with the measurement result, wherein the controller is configured to denote the calibration of said other one of the plurality of on-chip monitor circuits as invalid if the measurement result from the supervising one of the plurality of on-chip monitor circuits deviates from a predetermined range, the measurement result from the supervising one of the plurality of on-chip monitor circuits relating to a different parameter than the parameter said other one of the plurality of on-chip monitor circuit is configured to measure;
  a functional circuit configured to perform a function of the semiconductor chip; and
  a regulator circuit coupled to the circuit arrangement and the functional circuit, the regulator circuit configured to regulate a parameter of the functional circuit according to at least one measurement result from at least one of the plurality of on-chip monitor circuits.

24. The system of claim 23, wherein the plurality of on-chip monitor circuits and the functional circuit are arranged on the semiconductor chip.

* * * * *